US010547337B2

(12) United States Patent
Horita et al.

(10) Patent No.: US 10,547,337 B2
(45) Date of Patent: Jan. 28, 2020

(54) RADIO FREQUENCY FRONT-END CIRCUIT AND COMMUNICATION DEVICE

(71) Applicant: Murata Manufacturing Co., Ltd., Kyoto (JP)

(72) Inventors: Atsushi Horita, Kyoto (JP); Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/044,679

(22) Filed: Jul. 25, 2018

(65) Prior Publication Data

US 2018/0331703 A1   Nov. 15, 2018

Related U.S. Application Data

(63) Continuation of application No. PCT/JP2016/083327, filed on Nov. 10, 2016.

(30) Foreign Application Priority Data

Jan. 26, 2016 (JP) .................................. 2016-012852

(51) Int. Cl.
*H04B 1/44* (2006.01)
*H04B 1/04* (2006.01)
(Continued)

(52) U.S. Cl.
CPC .................. *H04B 1/18* (2013.01); *H03F 1/56* (2013.01); *H03F 3/195* (2013.01); *H03H 7/38* (2013.01);
(Continued)

(58) Field of Classification Search
CPC ... H04B 1/04; H04B 1/18; H04B 1/62; H04B 1/0057; H04B 1/0433; H03F 1/189;
(Continued)

(56) References Cited

U.S. PATENT DOCUMENTS 6,954,621 B2 * 10/2005 Bauernschmitt ...... H03F 1/3247
455/114.3
7,010,280 B1 * 3/2006 Wilson ................ H04L 27/2046
455/114.2
(Continued)

FOREIGN PATENT DOCUMENTS

CN   102082752 A   6/2011
CN   103166654 A   6/2013
(Continued)

OTHER PUBLICATIONS

International Search Report for International Application No. PCT/JP2016/083327, dated Jan. 31, 2017.
Written Opinion for International Application No. PCT/JP2016/083327, dated Jan. 31, 2017.
Matsumura et al., "Up-conversion Type FR Front-end for TV White-space Wireless Communication System", IEICE Technical Report, Oct. 20, 2010, vol. 110, No. 252, pp. 19-23.

*Primary Examiner* — Quochien B Vuong
(74) *Attorney, Agent, or Firm* — Pearne & Gordon LLP

(57) ABSTRACT

A radio frequency front-end circuit performs, in a communication band made up of a plurality of communication channels within a particular frequency band used in a system, wireless communication through a use channel selected from among empty communication channels in the plurality of communication channels, the radio frequency front-end circuit including a transmission-side amplifier circuit and a transmission circuit both serving as a transmission-side circuit that produces, from a transmitted signal after being subjected to a predistortion process, a transmitted signal corresponding to the use channel, and a frequency variable filter serving as a tunable filter that attenuates a radio frequency signal of a spurious wave at least in an alternate adjacent channel relative to the use channel.

13 Claims, 10 Drawing Sheets

(51) Int. Cl.
  *H04B 1/18* (2006.01)
  *H04B 1/00* (2006.01)
  *H04B 1/48* (2006.01)
  *H03F 3/195* (2006.01)
  *H03H 7/38* (2006.01)
  *H03F 1/56* (2006.01)
  *H03H 9/54* (2006.01)
  *H03H 9/60* (2006.01)
  *H03H 9/64* (2006.01)

(52) U.S. Cl.
  CPC ............ *H04B 1/00* (2013.01); *H04B 1/0057* (2013.01); *H04B 1/04* (2013.01); *H04B 1/48* (2013.01); *H03F 2200/165* (2013.01); *H03F 2200/222* (2013.01); *H03F 2200/294* (2013.01); *H03F 2200/336* (2013.01); *H03F 2200/387* (2013.01); *H03H 9/542* (2013.01); *H03H 9/605* (2013.01); *H03H 9/6483* (2013.01); *H03H 2007/386* (2013.01); *H03H 2210/025* (2013.01)

(58) Field of Classification Search
  CPC ............ H03F 1/195; H03F 2200/165; H03F 2201/3233; H03H 7/38; H03H 2007/386
  USPC ........ 455/63.1, 67.13, 78, 114.2, 114.3, 295, 455/307; 375/396, 397, 296, 297
  See application file for complete search history.

(56) References Cited

U.S. PATENT DOCUMENTS

| | | | | |
|---|---|---|---|---|
| 7,317,353 | B2* | 1/2008 | Hayase | ......... H03F 1/3247 375/297 |
| 7,915,954 | B2* | 3/2011 | Raghupathy | ......... H03F 1/0222 330/149 |
| 8,412,132 | B2* | 4/2013 | Tang | ......... H03F 1/3247 375/296 |
| 10,177,719 | B2* | 1/2019 | Gazneli | ......... H03F 1/3247 |
| 2012/0064847 | A1 | 3/2012 | Xu et al. | |
| 2012/0307947 | A1 | 12/2012 | Kodama | |
| 2012/0321018 | A1 | 12/2012 | Chen | |
| 2013/0156074 | A1 | 6/2013 | Wang | |
| 2014/0285286 | A1 | 9/2014 | Bojer | |
| 2015/0304154 | A1 | 10/2015 | Utsunomiya et al. | |
| 2016/0065165 | A1 | 3/2016 | Kadota | |

FOREIGN PATENT DOCUMENTS

| | | |
|---|---|---|
| JP | 2012-065318 A | 3/2012 |
| JP | 2013-090165 A | 5/2013 |
| JP | 2015-207887 A | 11/2015 |
| WO | 2011/104804 A1 | 9/2011 |
| WO | 2014/192754 A1 | 12/2014 |

\* cited by examiner

RADIO FREQUENCY FRONT-END CIRCUIT AND COMMUNICATION DEVICE

This is a continuation of International Application No. PCT/JP2016/083327 filed on Nov. 10, 2016 which claims priority from Japanese Patent Application No. 2016-012852 filed on Jan. 26, 2016. The contents of these applications are incorporated herein by reference in their entireties.

BACKGROUND

Technical Field

The present disclosure relates to a radio frequency front-end circuit that performs wireless communication.

Background Art

Various techniques for effectively utilizing frequency bands used in wireless communication have been contrived. For example, Patent Document 1 discloses a system for performing wireless communication by utilizing the so-called TV white space.

The wireless communication utilizing the TV white space represents a technique of focusing on the situation that a frequency band used in TV broadcasting has been made open, and of trying to utilize the opened frequency band in the wireless communication. Thus, an empty channel (empty communication channel) not used in the TV broadcasting is utilized in the wireless communication. A wireless communication device selects one, which is to be used, from among empty communication channels in the communication band of the TV broadcasting, those channels being allocated in accordance with database, and performs the wireless communication by employing the selected use channel.

Patent Document 1: Japanese Unexamined Patent Application Publication No. 2013-90165

BRIEF SUMMARY

In a wireless communication system utilizing the TV white space, however, channels used in the TV broadcasting vary depending on districts. Therefore, empty channels and a use channel also vary. Furthermore, a band width of a frequency band of each communication channel used in the TV broadcasting is 6 MHz or 8 MHz, and a band width between the communication channels is about 0.5 to 1 MHz. In other words, the band width of the frequency band of each communication channel and the band width between the communication channels are narrow.

Accordingly, in the case of utilizing a system in which the empty channels and the use channel vary, and in which the frequency band of each communication channel and the band width between the communication channels are narrow, such as in the case of utilizing the TV white space, there is a problem that it is difficult to attenuate interference waves in an adjacent channel and an alternate adjacent channel relative to the varying use channel.

Accordingly, the present disclosure provides a radio frequency front-end circuit capable of reducing the interference waves in the adjacent channel and the alternate adjacent channel relative to the varying use channel.

Solution to Problem

The present disclosure according to one aspect provides a radio frequency front-end circuit that performs, in a communication band made up of a plurality of communication channels within a particular frequency band used in a system, wireless communication through a use channel selected from among empty communication channels in the plurality of communication channels, the radio frequency front-end circuit including a transmission-side circuit that produces, from a transmitted signal after being subjected to a predistortion process, a transmitted signal corresponding to the use channel, and a tunable filter that attenuates a radio frequency signal of a spurious wave at least in an alternate adjacent channel relative to the use channel.

With the above-described features, a spurious wave in an adjacent channel relative to the use channel is attenuated by the predistortion, and the spurious wave in the alternate adjacent channel relative to the use channel is attenuated by the tunable filter. Therefore, desired adjacent-channel interference characteristics can be reliably and precisely realized in an overall point of view with the effective action of respective frequency characteristics of the predistortion and the tunable filter. Because of no necessity of attenuating the spurious wave in the adjacent channel by, a significant advantage is obtained in that design of the tunable filter is simplified and entire design of the radio frequency front-end circuit is rationalized.

The radio frequency front-end circuit according to one aspect of the present disclosure may further include a signal terminal, and a calibration signal used to perform the predistortion process of the transmitted signal having passed through the tunable filter may be output to the signal terminal.

With the above-described features, a highly-precise predistortion process can be performed in accordance with the calibration signal.

In the radio frequency front-end circuit according to one aspect of the present disclosure, the tunable filter may allow passage of radio frequency signals in frequency bands of the use channel and the adjacent channel relative to the use channel.

With the above-described feature, since an extent by which the tunable filter has to change the amplitude and the phase (group delay) of a distortion component appearing in the adjacent channel is reduced, the distortion component can be more precisely detected, and the predistortion process can be executed with higher precision. As a result, a spurious signal in the adjacent channel relative to the use channel can be effectively attenuated.

In the radio frequency front-end circuit according to one aspect of the present disclosure, the tunable filter may be an acoustic wave resonator filter of frequency variable type.

With the above-described feature, since a narrow pass band and steep attenuation characteristics can be given to the tunable filter by using the acoustic wave resonator filter, the precision of the predistortion can be effectively improved, and the desired adjacent-channel interference characteristics can be reliably and precisely realized in an overall point of view.

According to one aspect of the present disclosure, the tunable filter may include a parallel resonator and a serial resonator, a resonance point of the parallel resonator may be present in the alternate adjacent channel, an anti-resonance point of the parallel resonator may be present in the adjacent channel, a resonance point of the serial resonator may be present in the adjacent channel, and an anti-resonance point of the serial resonator may be present in the alternate adjacent channel.

With the above-described features, the filter characteristics allowing the passage of the radio frequency signals in the use channel and the adjacent channel relative to the use channel while attenuating the spurious wave in the alternate adjacent channel relative to the use channel can be realized with control of the resonance points and the anti-resonance points.

According to one aspect of the present disclosure, the tunable filter may include a tunable low pass filter constituted by a parallel resonator, and a tunable high pass filter constituted by a parallel resonator.

With the above-described feature, the filter characteristics allowing the passage of the radio frequency signals in the use channel and the adjacent channel relative to the use channel while attenuating the spurious wave in the alternate adjacent channel relative to the use channel can be realized with control of respective cutoff frequencies of the low pass filter and the high pass filter.

In the radio frequency front-end circuit according to one aspect of the present disclosure, the transmission-side circuit may include an amplifier circuit that amplifies the transmitted signal after being subjected to the predistortion process.

With the above-described feature, the distortion component mainly generated in the amplifier circuit can be effectively suppressed by the predistortion.

The radio frequency front-end circuit according to one aspect of the present disclosure may further include a detection unit that detects, from the transmitted signal, a signal reflected by an antenna.

With the above-described feature, since a value of the calibration signal can be corrected by detecting a significant change of the predistortion, the effect of the predistortion can be continuously obtained even when a load of the antenna ANT fluctuates.

In the radio frequency front-end circuit according to one aspect of the present disclosure, the detection unit may be disposed in a transfer path of the transmitted signal after passing through the tunable filter, and the signal terminal may be laid to extend from the detection unit.

With the above-described features, the signal terminal and the detection unit can be constituted in a common unit. As a result, the number of components can be reduced, and downsizing can be realized.

The radio frequency front-end circuit according to one aspect of the present disclosure may further include a reception-side circuit, an antenna-side circuit, a demultiplexing circuit, a frequency fixed filter, and a second tunable filter. The reception-side circuit transfers a received signal corresponding to the use channel. The antenna-side circuit transfers the transmitted signal and the received signal. The demultiplexing circuit connects the transmission-side circuit and the reception-side circuit to the antenna-side circuit. The frequency fixed filter allows passage of a radio frequency signal in the particular frequency band used in the system. The second tunable filter is disposed between the demultiplexing circuit and the tunable filter, and attenuates intermodulation distortion in the particular frequency band.

With the above-described features, in a circuit of performing transmission and reception via a common antenna, it is possible to pass the radio frequency signal in the use channel with a low loss, and to effectively attenuate not only a radio frequency signal that is present in a frequency band inside the communication band other than the use channel, and that includes the intermodulation distortion, but also a radio frequency signal in a frequency band outside the communication band.

In the radio frequency front-end circuit according to one aspect of the present disclosure, the system may be a wireless communication system utilizing a TV white space.

The particular frequency band may be a frequency band used in TV broadcasting, and the communication channel may be a channel used in the TV broadcasting.

The above-described features represent the case in which the frequency band of the communication channel is narrow and a frequency interval between the relevant communication channel and an adjacent communication channel is also narrow. The spurious signal can be more effectively reduced in that case.

Furthermore, the present disclosure according to one aspect provides a communication device including one of the radio frequency front-end circuits described above, a memory storing the calibration signal, and a radio frequency integrated circuit that produces the transmitted signal after being subjected to the predistortion process by using the calibration signal stored in the memory, and that outputs, to the radio frequency front-end circuit, the transmitted signal after being subjected to the predistortion process.

The communication device may further include a baseband integrated circuit outputting, to the radio frequency integrated circuit, the transmitted signal that has been subjected to the predistortion process in accordance with the calibration signal taken out from the signal terminal of the radio frequency front-end circuit.

With the above-described features, since interference waves in the adjacent channel and the alternate adjacent channel relative to the varying use channel are reduced by the radio frequency front-end circuit, the communication device ensuring high-quality communication (with a high data transfer rate and good voice quality) can be realized.

Advantageous Effects of Disclosure

According to the present disclosure, the interference waves in the adjacent channel and the alternate adjacent channel relative to the varying use channel can be reduced.

DETAILED DESCRIPTION

Figure 1:
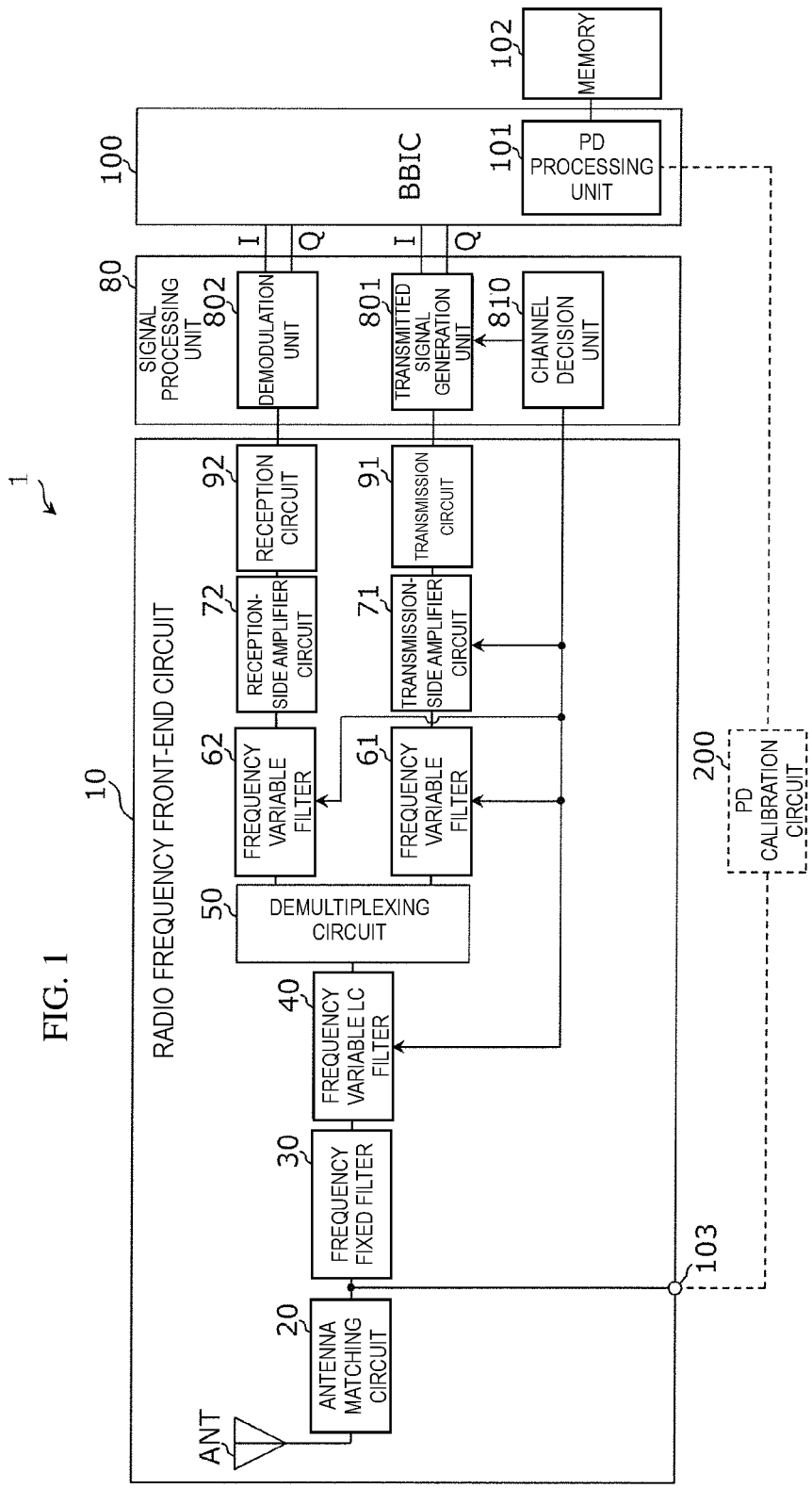
FIG. 1 is a functional block diagram of a radio frequency front-end circuit according to a first embodiment of the present disclosure.

A radio frequency front-end circuit according to a first embodiment of the present disclosure will be described below with reference to the drawings. FIG. 1 is a functional block diagram of a communication device including the radio frequency front-end circuit according to the first embodiment of the present disclosure.

A communication device 1 includes a radio frequency front-end circuit 10, a signal processing unit 80, a baseband (BB) IC 100, and a memory 102. The BBIC 100 includes a predistortion (PD) processing unit 101.

The memory 102 is connected to the BBIC 100. The memory 102 previously stores a distortion component that is generated in a transmitted signal attributable to the radio frequency front-end circuit 10 (more specifically, nonlinear characteristics of a transmission-side amplifier circuit 71). The distortion component represents, for example, a gap between a transmitted signal output by the BBIC 100 and an actually transmitted signal.

The PD processing unit 101 calculates the distortion component on the basis of the transmitted signal obtained via a PD calibration circuit 200, and stores the calculated distortion component in the memory 102. In actual communication, a distortion component contained in the actually transmitted signal is canceled by outputting the transmitted signal from the BBIC 100 after adding thereto a component that is given as the distortion component stored in the memory 102, but that has a reversed phase. In the following description, a process of adding, to the transmitted signal, a component being the same as the distortion component, but having a reversed phase is called a predistortion process (or simply predistortion).

The PD calibration circuit 200 is constituted, for example, by a down-converter and an analog-digital (AD) conversion circuit (not illustrated). The PD calibration circuit 200 converts the transmitted signal of the radio frequency front-end circuit 10 to a baseband signal, and supplies it to the BBIC 100. The PD calibration circuit 200 is not always required to be part of the communication device 1, and it may be part of an adjustment device that is connected to the radio frequency front-end circuit 10 and the BBIC 100 only when the predistortion is to be calibrated, for example.

The radio frequency front-end circuit 10 includes an antenna ANT, an antenna matching circuit 20, a frequency fixed filter 30, a frequency variable LC filter 40, a demultiplexing circuit 50, frequency variable filters 61 and 62, a transmission-side amplifier circuit 71, a reception-side amplifier circuit 72, a transmission circuit 91, a reception circuit 92, and a PD calibration signal terminal 103. The signal processing unit 80 includes a transmitted signal generation unit 801, a demodulation unit 802, and a channel decision unit 810. The signal processing unit 80 may be constituted by a radio frequency integrated circuit, for example.

The frequency variable LC filter 40 corresponds to a "second tunable filter" in the present disclosure. Each of the frequency variable filters 61 and 62 corresponds to a "tunable filter" in the present disclosure.

The antenna ANT is connected to the antenna matching circuit 20. The antenna matching circuit 20 is connected to the frequency fixed filter 30. The antenna matching circuit 20 may be a fixed matching circuit or a tunable matching circuit. The frequency fixed filter 30 is connected to the frequency variable LC filter 40. The frequency variable LC filter 40 is connected to an antenna-side terminal of the demultiplexing circuit 50.

A transmission-side terminal of the demultiplexing circuit 50 is connected to the frequency variable filter 61. The frequency variable filter 61 is connected to the transmission-side amplifier circuit 71. The transmission-side amplifier circuit 71 is connected to the transmission circuit 91. The transmission circuit 91 is connected to the transmitted signal generation unit 801 in the signal processing unit 80.

A reception-side terminal of the demultiplexing circuit 50 is connected to the frequency variable filter 62. The frequency variable filter 62 is connected to the reception-side amplifier circuit 72. The reception-side amplifier circuit 72 is connected to the reception circuit 92. The reception circuit 92 is connected to the demodulation unit 802 in the signal processing unit 80.

A circuit disposed on the side closer to the antenna ANT than the demultiplexing circuit 50 corresponds to an "antenna-side circuit" in the present disclosure. A circuit disposed on the side from the demultiplexing circuit 50 to the transmission circuit 91 corresponds to a "transmission-side circuit" in the present disclosure. A circuit disposed on the side from the demultiplexing circuit 50 to the reception circuit 92 corresponds to a "reception-side circuit" in the present disclosure.

The radio frequency front-end circuit 10 transmits and receives radio frequency signals in a communication band made up of a plurality of communication channels by utilizing an empty communication channel. The radio frequency front-end circuit 10 transmits and receives the radio frequency signals in accordance with the specifications of the TV white space, for example.

In accordance with the specifications of the TV white space, the empty communication channel to be used is given by one among a plurality of communication channels set in a UHF band of TV broadcasting, i.e. in a communication band of 470 [MHz] to 790 [MHz], and each having a frequency band width of 6 [MHz], the one being not used to transmit TV broadcasting signals. When a plurality of empty channels adjacent to each other is simultaneously utilized in a bundled state, the communication band width is not limited to the above-mentioned value.

The antenna matching circuit 20 performs impedance matching between the antenna ANT and a circuit on the side from the frequency fixed filter 30 to the signal processing unit 80. The antenna matching circuit 20 is constituted by an inductor and a capacitor. In the antenna matching circuit 20, values of inductor and capacitor elements are set, for example, such that a reflection loss of the antenna ANT is held to be not more than a desired value in the entirety of the communication band.

The frequency fixed filter 30 is constituted by an inductor and a capacitor. In other words, the frequency fixed filter 30 is an LC filter of frequency fixed type. In the frequency fixed filter 30, values of inductor and capacitor elements are set such that a frequency band of the communication band falls within a pass band, and that a frequency band outside the communication band falls within an attenuation range. The frequency fixed filter 30 is constituted by a low pass filter, for example.

In the frequency fixed filter 30, the frequency band of the communication band falls within the pass band, and a frequency band higher than the frequency band of the communication band falls within the attenuation range. Thus, the frequency fixed filter 30 transfers the radio frequency signal in the communication band with a low loss, and attenuates the radio frequency signal outside the communication band. In practice, the frequency fixed filter 30 may allow passage of the radio frequency signal in the frequency band used in the TV broadcasting, and may attenuate the radio frequency signal in other frequency bands.

The frequency variable LC filter 40 includes at least a variable capacitor, and further includes at least one of each of an inductor and a capacitor. In other words, the frequency variable LC filter 40 is an LC filter of frequency variable type. The frequency variable LC filter 40 is a filter having an attenuation pole, such as a band pass filter or a notch filter.

The frequency variable LC filter 40 changes the pass band and the attenuation range depending on a wireless communication channel and an occupied communication channel that may cause IMD (intermodulation distortion). The term "wireless communication channel" stands for a channel that is one of the empty communication channels, the one being used in the wireless communication. The term "occupied communication channel" stands for a communication channel used in the TV broadcasting.

The frequency variable LC filter 40 allows passage of the radio frequency signal in the frequency band of the wireless communication channel with a low loss, and attenuates the radio frequency signal in the frequency band of the occupied communication channel, which may cause IMD, at a desired attenuation. The frequency variable LC filter 40 attenuates the radio frequency signal in at least one among the plurality of occupied communication channels that may cause IMD.

More specifically, the frequency variable LC filter 40 is formed of a band pass filter. In this case, the frequency band of the wireless communication channel is set to fall within a pass band of the frequency variable LC filter 40. Furthermore, the band pass filter forming the frequency variable LC filter 40 has an attenuation pole on the lower frequency side of the pass band. Alternatively, the band pass filter may have attenuation poles on both the sides of the pass band.

Here, a frequency and a depth of the attenuation pole on the lower frequency side or the higher frequency side of the band pass filter are determined so as to obtain the desired attenuation at the frequency of at least one among the plurality of occupied communication channels that may cause IMD. The desired attenuation stands for an amount of attenuation at which an IMD wave is sufficiently suppressed and reception sensitivity in the wireless communication channel becomes a level enabling wireless communication to be performed.

With the above-described configuration, it is possible to suppress the IMD wave from being generated in a nearby frequency region including the wireless communication channel, and to increase the reception sensitivity in the wireless communication channel. Regarding the communication band used in the TV broadcasting, for example, the nearby frequency region is defined as a frequency region covering up to a communication channel that is positioned three-channel away from the frequency of the wireless communication channel.

The demultiplexing circuit 50 is constituted by a circulator, a duplexer, or a switch, for example. The demultiplexing circuit 50 outputs the transmitted signal (radio frequency signal) input from the transmission-side terminal to the antenna-side terminal, and outputs the received signal (radio frequency signal) input from the antenna-side terminal to the reception-side terminal.

Each of the frequency variable filters 61 and 62 includes at least a resonator and a variable capacitor, and further includes at least one of each of an inductor and a capacitor depending on filter characteristics. In other words, the frequency variable filters 61 and 62 are each a resonator filter of frequency variable type. The frequency variable filters 61 and 62 are each a band pass filter utilizing a resonance point and an anti-resonance point of the resonator. Practical circuit configurations of the frequency variable filters 61 and 62 are described later. Because basic configurations of the frequency variable filters 61 and 62 are the same, the following description is made about the frequency variable filter 61.

The frequency variable filter 61 changes the pass band and the attenuation range depending on the selected channel. In this connection, a frequency band of the selected channel is included in the pass band.

The frequency variable filter 61 has attenuation poles on both the side of the pass band on a frequency axis. Because the frequency variable filter 61 is the resonator filter, attenuation characteristics in the pass band are steeper than those in an LC filter.

Thus, the frequency variable filter 61 transfers the radio frequency signal in the selected channel with a low loss, and attenuates the radio frequency signals in an alternate adjacent channel relative to the selected channel. The frequency variable filter 61 may attenuate not only the radio frequency signal in the alternate adjacent channel, but also the radio frequency signals in frequency bands of an adjacent channel relative to the alternate adjacent channels and in a further adjacent channel relative to the former adjacent channel. A frequency band width in which the radio frequency signals are to be attenuated may be set as appropriate depending on the system configurations.

The transmission-side amplifier circuit 71 includes the so-called amplifier element. The transmission-side amplifier circuit 71 receives the transmitted signal via the transmission circuit 91 including a matching circuit, and outputs the transmitted signal to the frequency variable filter 61 after amplifying the same. The reception-side amplifier circuit 72 includes the so-called LNA (low noise amplifier). The reception-side amplifier circuit 72 amplifies the received signal output from the frequency variable filter 62, and outputs the received signal to the demodulation unit 802 via the reception circuit 92 including a matching circuit.

The channel decision unit 810 in the signal processing unit 80 detects the empty communication channels in the communication band. For instance, the channel decision unit 810 obtains an empty channel map from the outside, and detects the empty channels on the basis of the map. The channel decision unit 810 selects at least one of the empty communication channels, and sets that empty communication channel as the selected channel. The channel decision unit 810 outputs the selected channel to the transmitted signal generation unit 801. The transmitted signal generation unit 801 produces the transmitted signal as a radio frequency signal of a frequency in the selected channel, and outputs the transmitted signal to the transmission-side amplifier circuit 71. Though not illustrated, the channel decision unit 810 further outputs the selected channel to the demodulation unit 802. The demodulation unit 802 demodulates the received signal in accordance with a local signal determined basing on the selected channel.

The empty communication channel map may be obtained from a circuit outside the radio frequency front-end circuit 10, but it may be alternatively obtained by demodulating a communication signal that is received by the antenna ANT and that contains map information. In this connection, tunable filter information denoting the frequency of a spurious wave contained in the communication band and indicating, for example, the attenuation required to attenuate the spurious wave to a desired value may be obtained instead of the map information. In the case of obtaining the tunable filter information, the channel decision unit 810 is just needed to make setting of at least one of the frequency variable LC filter 40 and the frequency variable filters 61 and 62 in accordance with the obtained tunable filter information.

The signal processing unit 80 further includes a circuit configuration to implement desired functions, such as voice communication and data communication, by utilizing the communication signal that is used by the radio frequency front-end circuit 10 for the wireless communication.

The channel decision unit 810 still further outputs the selected channel to the frequency variable LC filter 40, the transmission-side amplifier circuit 71, the frequency variable filter 61, and the frequency variable filter 62. The frequency variable LC filter 40, the frequency variable filter 61, and the frequency variable filter 62 realize the above-described filter characteristics by using the selected channel. The transmission-side amplifier circuit 71 performs a process of amplifying the transmitted signal by using the selected channel.

The advantageous effects obtained with the radio frequency front-end circuit 10 will be described below.

Figure 2:
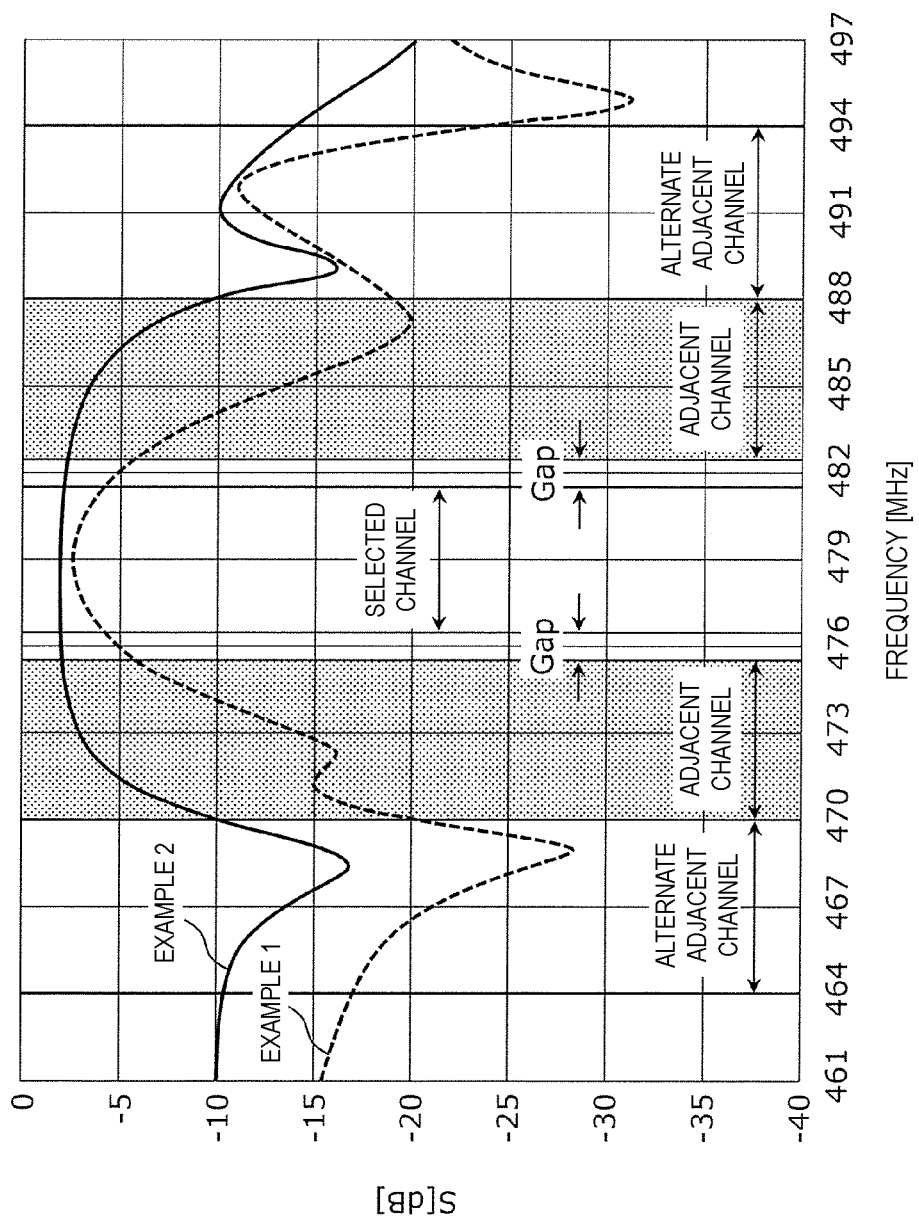
FIG. 2 is a graph depicting transmission characteristics of the radio frequency front-end circuit according to the first embodiment of the present disclosure.

FIG. 2 is a graph depicting two types of transmission characteristics (Example 1 and Example 2) of the frequency variable filter 61 according to the first embodiment of the present disclosure. FIG. 2 depicts the transmission characteristics in five consecutive communication channels. FIG. 2 represents the case in which a central channel is the selected channel (i.e., the empty communication channel used by the radio frequency front-end circuit 10 to perform communication).

The transmission characteristics of Example 1 have substantially the same pass band as that of the selected channel, and have attenuation poles in adjacent channels on both the sides of the selected channel. The transmission characteristics of Example 2 have substantially the same pass band as that of three communication channels including the selected channel and the adjacent channels on both the sides of the selected channel, and have attenuation poles in alternate adjacent channels on both the sides of the selected channel. Here, the term "pass band" stands for a band in which the attenuation of a signal is less than a predetermined threshold. The predetermined threshold may be −10 dB, for example. Furthermore, giving the attenuation of less than the predetermined threshold to a signal is equivalent to allowing passage of the signal.

Figure 3:
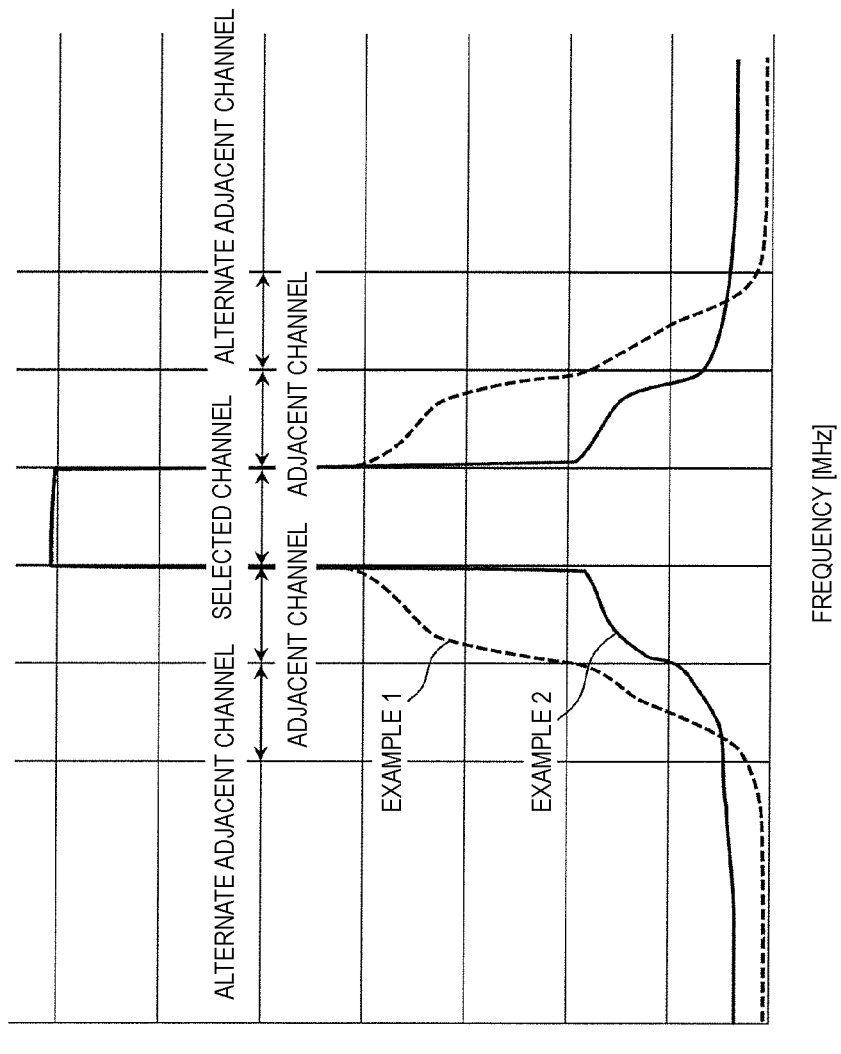
FIG. 3 is a graph depicting an adjacent channel leakage ratio of the radio frequency front-end circuit according to the first embodiment of the present disclosure.

FIG. 3 is a graph depicting an adjacent channel leakage ratio (ACLR) of the radio frequency front-end circuit in the cases of using the frequency variable filters 61 having the transmission characteristics of Example 1 and Example 2, respectively.

In both the cases of using the frequency variable filters 61 having the transmission characteristics of Example 1 and Example 2, respectively, the ACLR is steeply reduced at both the ends of the selected channel. This represents characteristics obtained with the predistortion.

In the specifications utilizing the TV white space, the band width per channel is as narrow as several MHz (e.g., 6 MHz), and the channel interval is also narrow. Thus, a filter is demanded to have a narrow band width and steep attenuation characteristics. However, a tunable filter having the steep attenuation characteristics and being tunable depending on the selected channel is complicated and needs intricate design. In consideration of the above point, a significant effect of suppressing the ACLR can be obtained by performing the predistortion and reducing the distortion component that is generated in the transmitted signal in the transmission side circuit (especially, in the transmission-side amplifier circuit 71).

It is to be noted here that the ACLR in the adjacent channels becomes smaller when the frequency variable filter 61 allows passage of the radio frequency signals in the adjacent channels on both the sides of the selected channel (i.e., in Example 2) than when the frequency variable filter 61 attenuates those radio frequency signals (i.e., in Example 1). The above result is presumably attributable to the fact that an extent by which the frequency variable filter 61 has to change the amplitude and the phase (group delay) of the distortion component in the adjacent channel is reduced, whereby the distortion component can be more precisely detected and the predistortion can be executed with higher precision.

Thus, the feature that the frequency variable filter 61 has the transmission characteristics allowing passage of the radio frequency signals within the frequency bands of the selected channel and the adjacent channels on both the sides of the selected channel is not necessarily essential, but it is useful to reduce adjacent channel interference when the frequency variable filter 61 is used in combination with the predistortion.

As seen from the filter characteristics illustrated in FIG. 2, each of the attenuation ranges of the frequency variable filter 61 includes a frequency band where the attenuation is reduced, in part of a frequency band on the opposite side to the pass band with the attenuation pole being reference. However, since the frequency variable filter 61, the frequency variable LC filter 40, and the frequency fixed filter 30 are connected in series in a transfer path of the radio frequency signal, the sufficient attenuation can be obtained with the frequency variable LC filter 40 and the frequency fixed filter 30 even in the frequency band where the attenuation is not satisfactorily obtained with the frequency variable filter 61.

It is hence possible to transfer the radio frequency signal in the selected channel with a low loss, and to attenuate the radio frequency signals in frequency bands other than the selected channel, those frequency bands including the adjacent channels. Similar advantageous effects can also be obtained even when the selected channel is changed over.

As described above, when wireless communication is performed in a communication band made up of a plurality of communication channels through a selected communication channel (selected channel), the wireless communication can be implemented through the selected channel with less adjacent channel interference by employing the configuration of the radio frequency front-end circuit 10 according to this embodiment.

Figure 4:
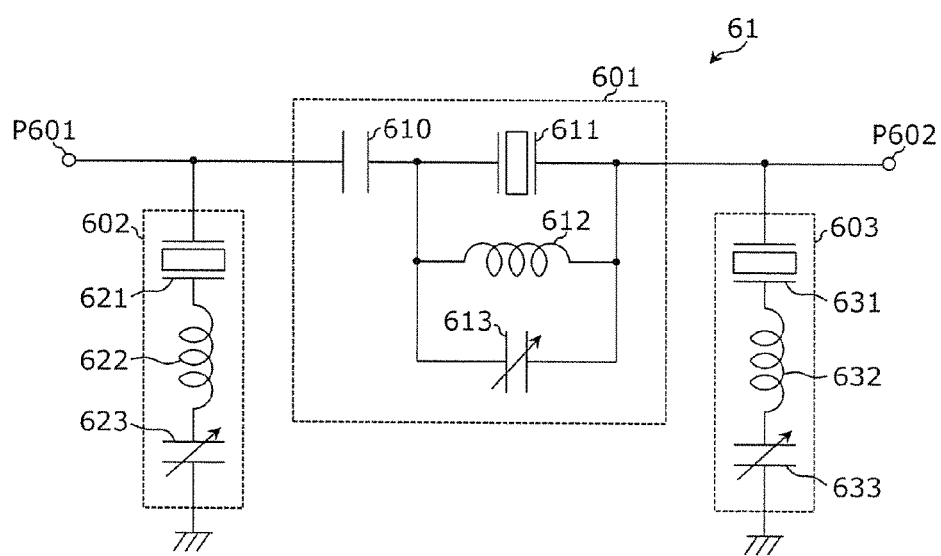
FIG. 4 is a circuit diagram illustrating a first configuration of a frequency variable filter of resonator filter type according to an embodiment of the present disclosure.

Practical configurations of a frequency variable filter of resonator filter type in the radio frequency front-end circuit according to an embodiment will be described below. FIG. 4 is a circuit diagram illustrating a first configuration of the frequency variable filter of resonator filter type according to the embodiment of the present disclosure. A resonator in the following description is a piezoelectric resonator such as a SAW resonator, for example.

The frequency variable filter 61 includes a serial arm resonance circuit 601, a first parallel arm resonance circuit 602, a second parallel arm resonance circuit 603, and connection terminals P601 and P602. The serial arm resonance circuit 601 is an example a serial resonator, and the first parallel arm resonance circuit 602 and the second parallel arm resonance circuit 603 are each an example a parallel resonator.

The serial arm resonance circuit 601 is connected between the connection terminal P601 and the connection terminal P602. The first parallel arm resonance circuit 602 is connected between a terminal of the serial arm resonance circuit 601 on the side closer to the connection terminal P601 and a ground potential. The second parallel arm resonance circuit 603 is connected between a terminal of the serial arm resonance circuit 601 on the side closer to the connection terminal P602 and the ground potential.

The serial arm resonance circuit 601 includes a capacitor 610, a resonator 611, an inductor 612, and a variable capacitor 613. The resonator 611, the inductor 612, and the variable capacitor 613 are connected in parallel. The capacitor 610 is connected in series to such a parallel circuit. A thus-formed resonance circuit is connected between the connection terminal P601 and the connection terminal P602. The capacitor 610 is connected to the connection terminal P601, i.e., the first parallel arm resonance circuit 602.

The first parallel arm resonance circuit 602 includes a resonator 621, an inductor 622, and a variable capacitor 623. The resonator 621, the inductor 622, and the variable capacitor 623 are connected in series. A thus-formed serial resonance circuit is connected to between the connection terminal P601 and the ground potential.

The second parallel arm resonance circuit 603 includes a resonator 631, an inductor 632, and a variable capacitor 633. The resonator 631, the inductor 632, and the variable capacitor 633 are connected in series. A thus-formed serial resonance circuit is connected between the connection terminal P602 and the ground potential.

The serial arm resonance circuit 601 and the first and second parallel arm resonance circuits 602 and 603 constitute a band pass filter utilizing resonance points and anti-resonance points of the resonators 611, 621 and 631. Thus, the frequency variable filter 61 functions as a band pass filter of which pass band is changed by changing capacitances of the variable capacitors 613, 623 and 633.

An impedance of the resonator 621 is lower than that of the resonator 631.

Figure 5:
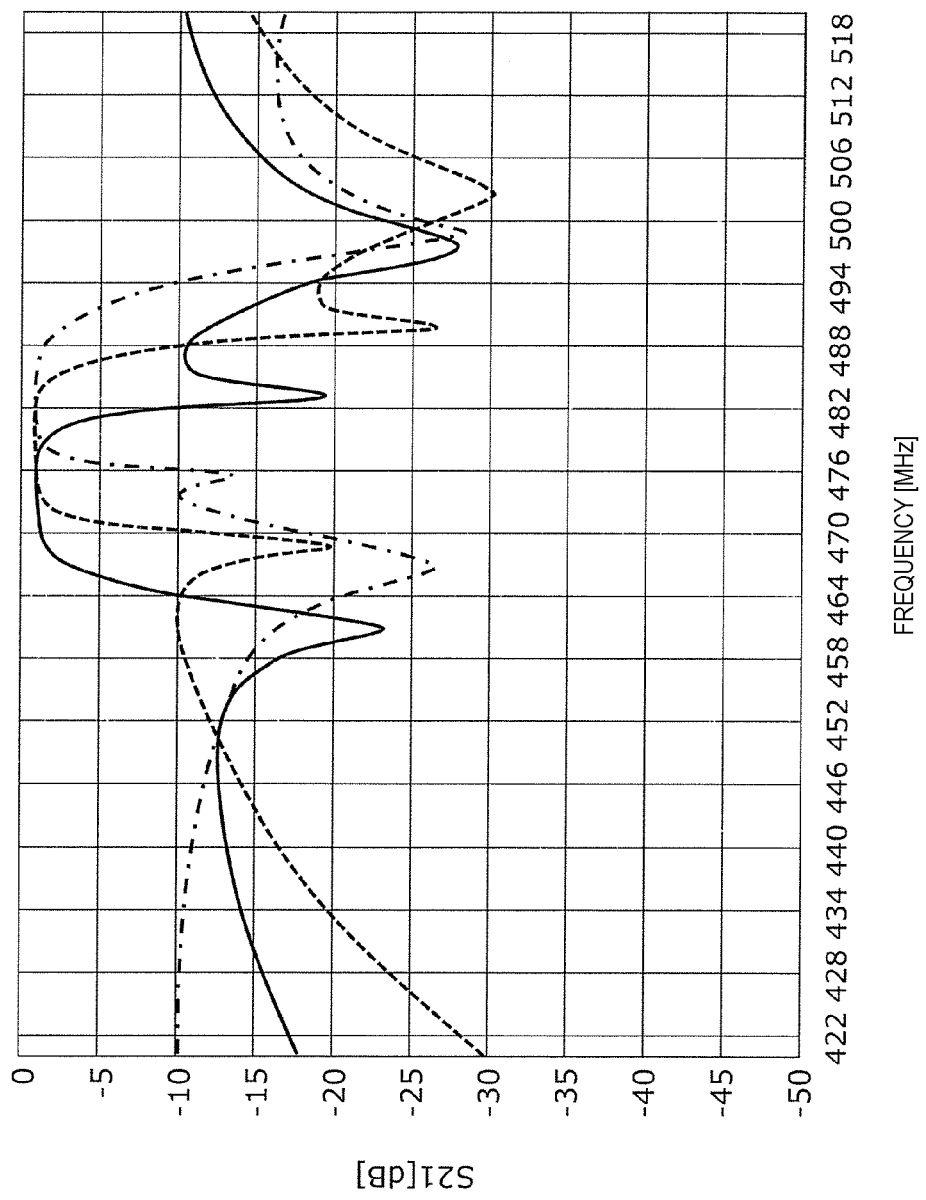
FIG. 5 is a graph depicting transmission characteristics of the frequency variable filter illustrated in FIG. 4.

FIG. 5 is a graph depicting transmission characteristics of the frequency variable filter illustrated in FIG. 4 in three cases in which the selected channel is different. As depicted in FIG. 5, filter characteristics having a pass band width of about 10 [MHz] and having attenuation poles on both the sides of a pass band can be realized by using the frequency variable filter 61.

A pass band width in which the signal attenuation is less than −10 dB is about 18 [MHz]. Taking the TV white band with the band width of one channel being 6 MHz, for example, the above-mentioned pass band corresponds to three channels, i.e., the selected channel and the adjacent channels on both the sides of the selected channel. In this case, the attenuation poles are positioned in the alternate adjacent channels. Those characteristics are formed, for example, by setting the resonance points of the first and second parallel arm resonance circuits 602 and 603 in the alternate adjacent channels relative to the selected channel and the anti-resonance points thereof in the adjacent channels relative to the selected channel, and by setting the resonance point of the serial arm resonance circuit 601 in the adjacent channel and the anti-resonance point thereof in the alternate adjacent channel.

In particular, the attenuation poles having steep attenuation characteristics and providing large attenuations can be formed on both the sides of the pass band on the frequency axis by connecting, as illustrated in FIG. 4, a capacitor to the serial arm resonance circuit 601 on the side closer to the first parallel arm resonance circuit 602, i.e., on the side closer to the resonant filter including the resonator having a lower impedance. As a result, the radio frequency signals in the frequency bands of the adjacent channels relative to the selected channel can be greatly attenuated.

Figure 6:
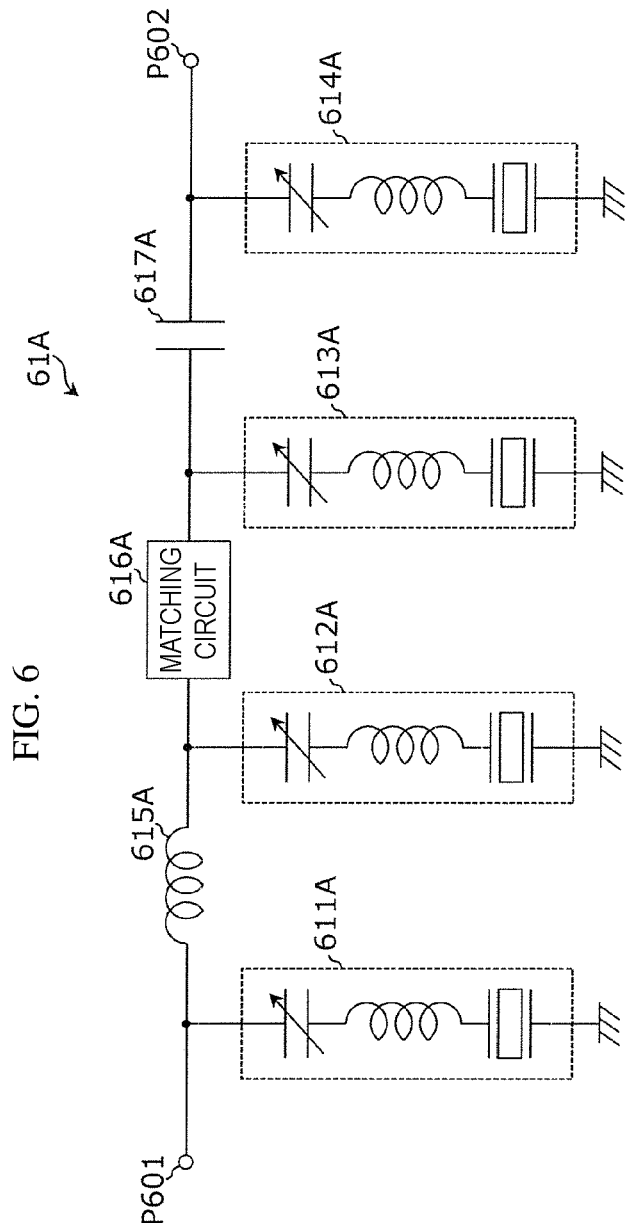
FIG. 6 is a circuit diagram illustrating a second configuration of the frequency variable filter of resonator filter type according to the embodiment of the present disclosure.

FIG. 6 is a circuit diagram illustrating a second configuration of the frequency variable filter of resonator filter type according to the embodiment of the present disclosure.

A frequency variable filter 61A includes resonance circuits 611A, 612A, 613A and 614A, an inductor 615A, a matching circuit 616A, a capacitor 617A, and connection terminals P601 and P602. The resonance circuits 611A, 612A, 613A and 614A are each constituted by a serial resonance circuit including a resonator, an inductor, and a variable capacitor.

The inductor 615A, the matching circuit 616A, and the capacitor 617A are connected between the connection terminal P601 and the connection terminal P602 in the mentioned order from the side close to the connection terminal P601.

The resonance circuit 611A is connected between a junction between the connection terminal P601 and the inductor 615A and the ground potential. The resonance circuit 612A is connected between a junction between the inductor 615A and the matching circuit 616A and the ground potential. The resonance circuit 613A is connected between a junction between the matching circuit 616A and the capacitor 617A and the ground potential. The resonance circuit 614A is connected between a junction between the capacitor 617A and the connection terminal P602 and the ground potential.

In other words, the frequency variable filter 61A is made up of a low pass filter and a high pass filter, which are constituted by the resonance circuits 611A, 612A, 613A and 614A each serving as a parallel resonator.

With the above-described configuration, it is also possible to pass the radio frequency signal in the selected channel with a low loss, and to attenuate the radio frequency signals in the adjacent channels relative to the selected channel.

Figure 7:
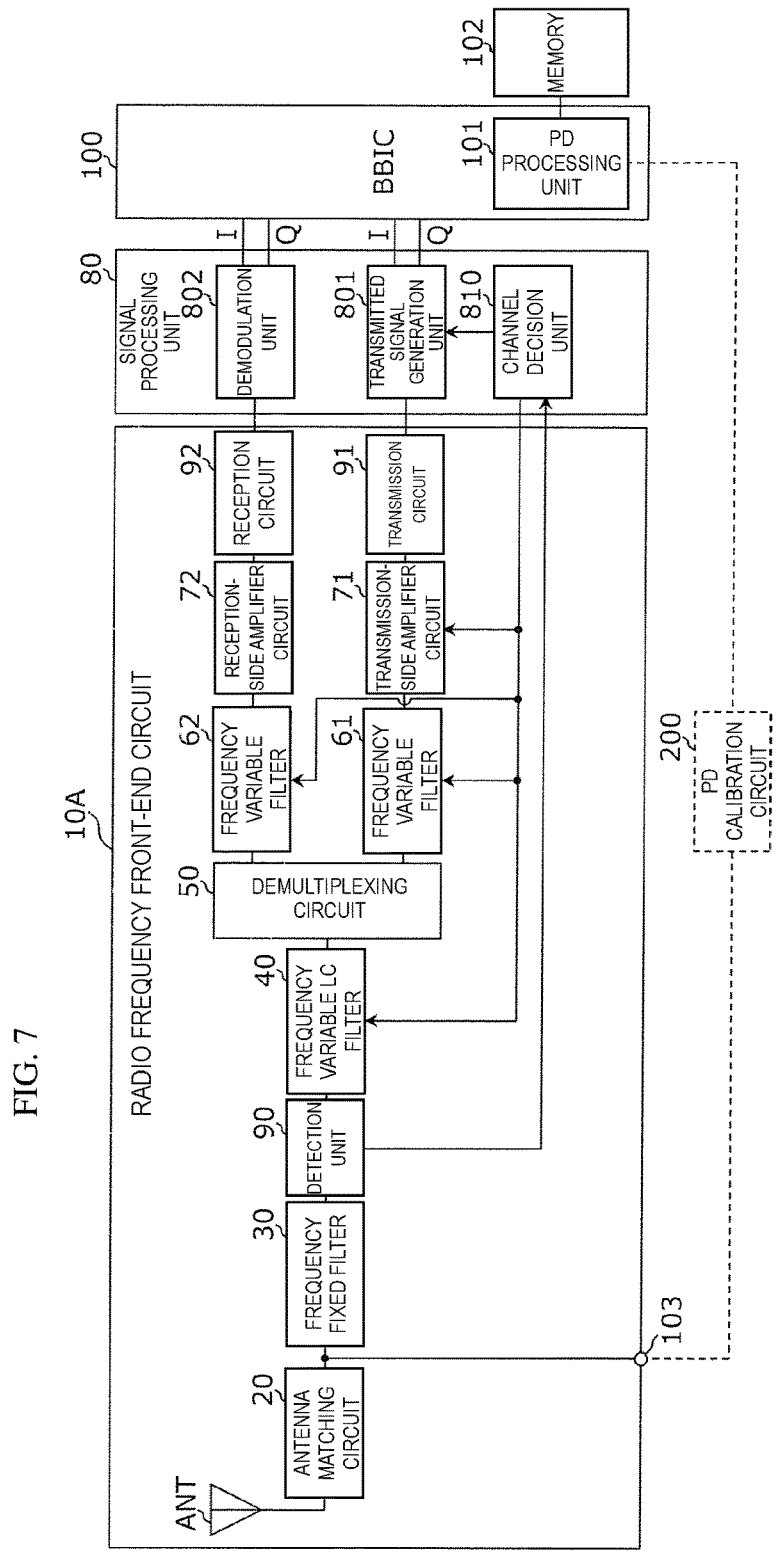
FIG. 7 is a functional block diagram of a radio frequency front-end circuit according to a second embodiment of the present disclosure.

A radio frequency front-end circuit according to a second embodiment of the present disclosure will be described below with reference to the drawing. FIG. 7 is a functional block diagram of the radio frequency front-end circuit according to the second embodiment of the present disclosure.

A radio frequency front-end circuit 10A according to the second embodiment is constituted by adding a detection unit 90 to the radio frequency front-end circuit 10 according to the first embodiment. The other configuration is the same as that of the radio frequency front-end circuit 10 according to the first embodiment.

The detection unit 90 is connected between the frequency fixed filter 30 and the frequency variable LC filter 40. The detection unit 90 detects a signal level (amplitude level) of each communication channel, and outputs the detected signal level to the channel decision unit 810.

The channel decision unit 810 decides, as the selected channel, one among the plurality of empty communication channels, the one having a maximum signal level.

With such a configuration, the wireless communication can be performed by using the communication channel in which a reception level is high.

Furthermore, the detection unit 90 detects, from the transmitted signal, a signal reflected by the antenna ANT. Thus, a value of a calibration signal stored in the memory 102 can be corrected by detecting a significant mismatch of the predistortion. Accordingly, the effect of the predistortion can be continuously obtained even when a load of the antenna ANT fluctuates.

While the detection unit 90 may be disposed between the antenna ANT and the demultiplexing circuit 50 as in this embodiment, an entirely different circuit dedicated for the detection may be disposed. Alternatively, the detection unit 90 may be disposed in the signal processing unit 80 or the demodulation unit 802.

Figure 8:
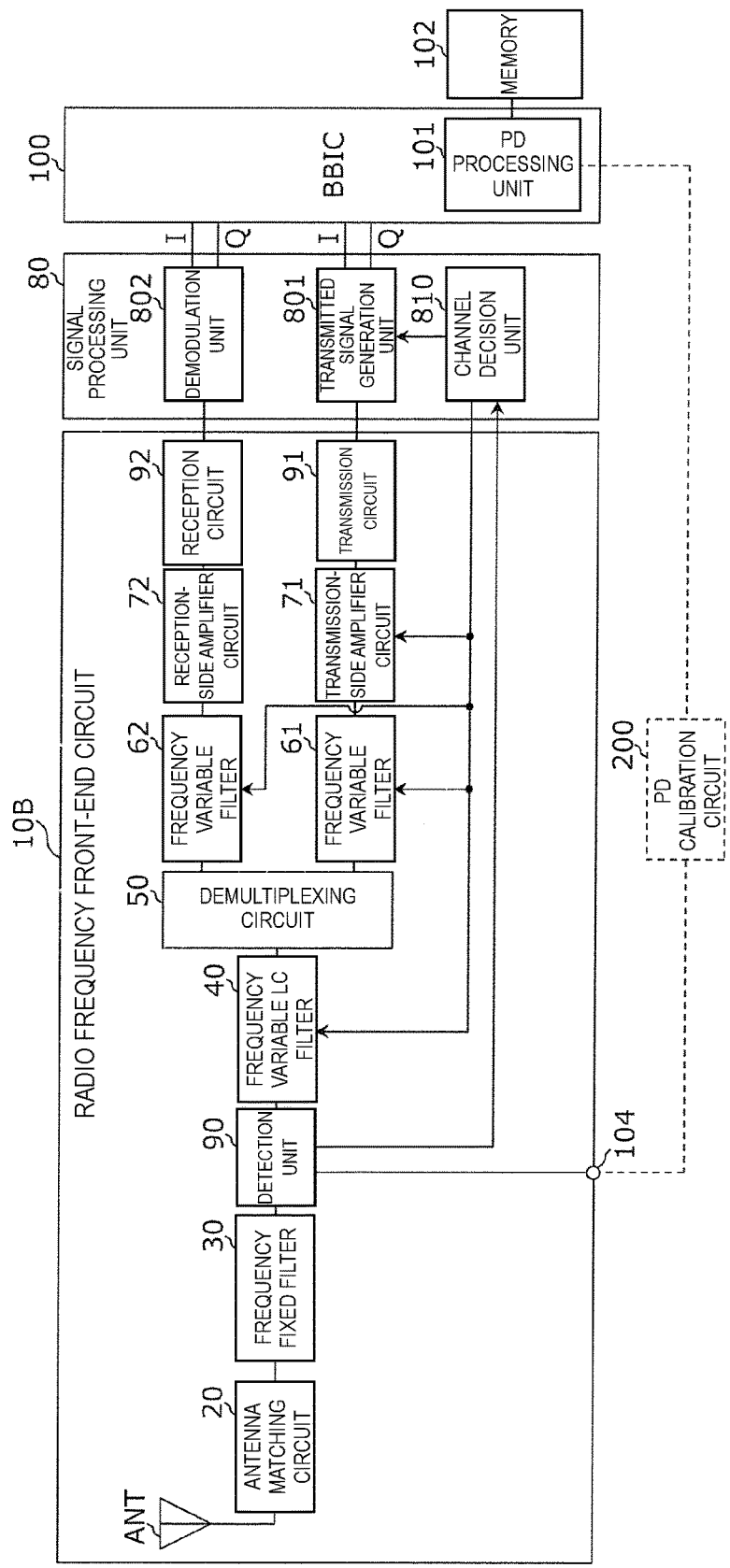
FIG. 8 is a functional block diagram of a radio frequency front-end circuit according to a third embodiment of the present disclosure.

A radio frequency front-end circuit according to a third embodiment of the present disclosure will be described below with reference to the drawing. FIG. 8 is a functional block diagram of the radio frequency front-end circuit according to the third embodiment of the present disclosure.

A radio frequency front-end circuit 10B according to the third embodiment is constituted by disposing, instead of the PD calibration signal terminal 103, a PD calibration signal terminal 104 extending from the detection unit 90 in the radio frequency front-end circuit 10A according to the second embodiment. The other configuration is the same as that of the radio frequency front-end circuit 10A according to the second embodiment.

With such a configuration, the PD calibration signal terminal 104 and the detection unit 90 can be constituted in a common unit. As a result, the number of components can be reduced, and downsizing can be realized.

Figure 9:
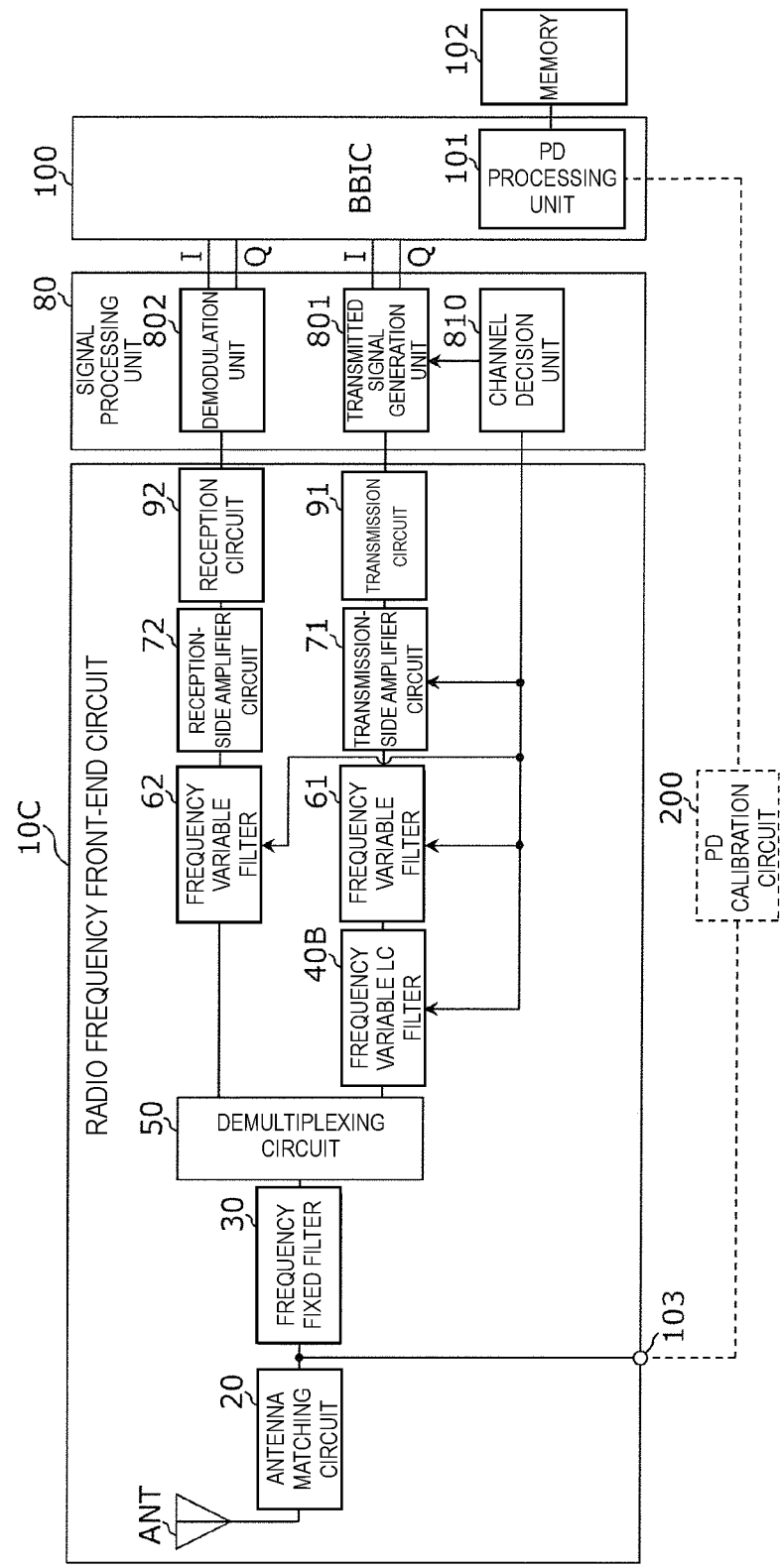
FIG. 9 is a functional block diagram of a radio frequency front-end circuit according to a fourth embodiment of the present disclosure.

A radio frequency front-end circuit according to a fourth embodiment of the present disclosure will be described below with reference to the drawing. FIG. 9 is a functional block diagram of the radio frequency front-end circuit according to the fourth embodiment of the present disclosure.

A radio frequency front-end circuit 10C according to the fourth embodiment is different from the radio frequency front-end circuit 10 according to the first embodiment in a connected position of a frequency variable LC filter 40B. A basic configuration of the frequency variable LC filter 40B is the same as that of the frequency variable LC filter 40 in the first embodiment.

With the above-described configuration, similar advantageous effects to those in the first embodiment can be obtained for at least the transmitted signal, and a loss (pass loss) of the received signal can be reduced.

Figure 10:
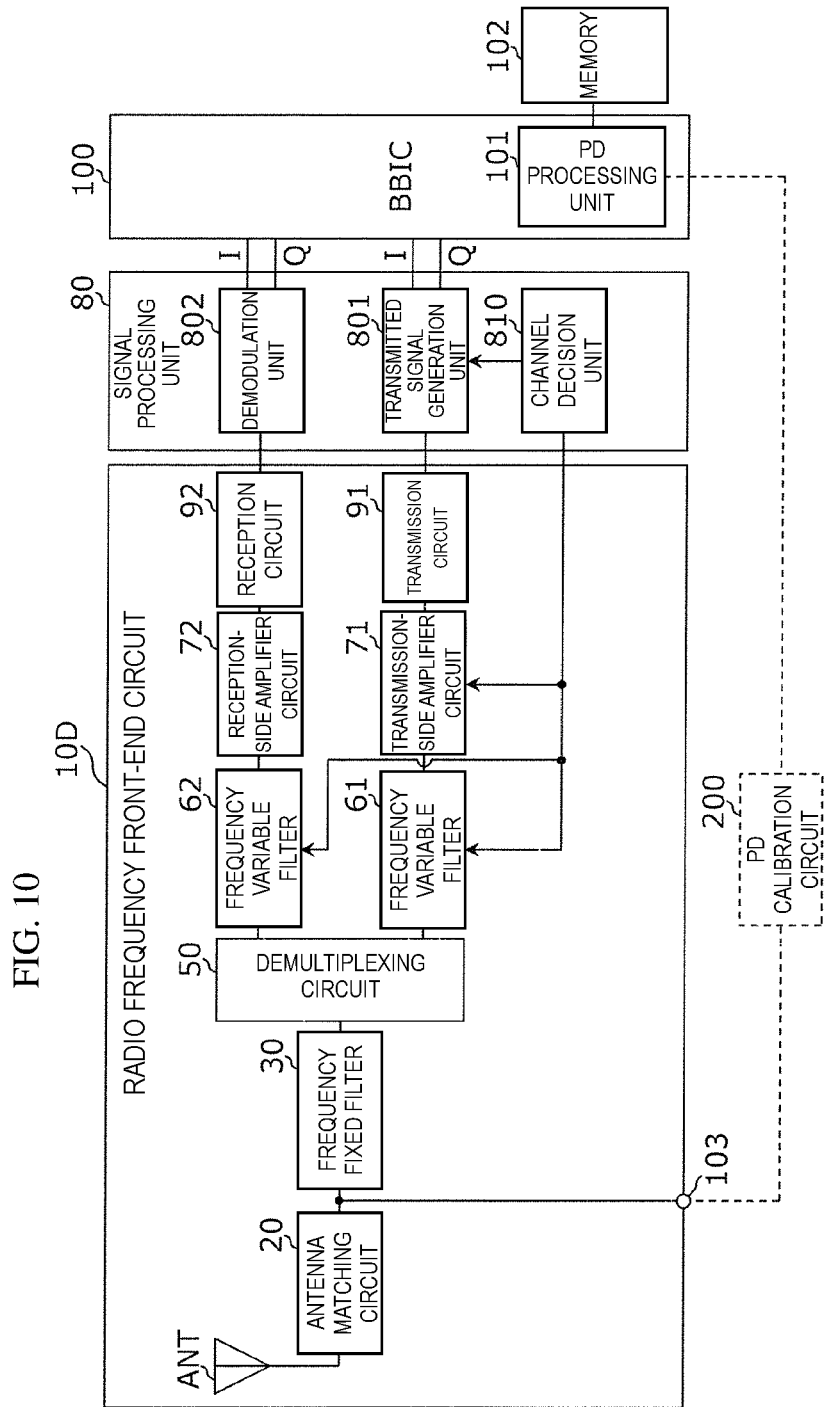
FIG. 10 is a functional block diagram of a radio frequency front-end circuit according to a fifth embodiment of the present disclosure.

While each of the above-described embodiments has the configuration including three types of filters in the transfer path for the communication signal at least in the transmission system, a configuration including two types of filters may also be employed as in a fifth embodiment described below. FIG. 10 is a functional block diagram of a radio frequency front-end circuit according to a fifth embodiment of the present disclosure.

A radio frequency front-end circuit 10D according to the fifth embodiment is different from the radio frequency front-end circuit 10 according to the first embodiment in that the frequency variable LC filter 40 is omitted. The other configuration is the same as that of the radio frequency front-end circuit 10 according to the first embodiment.

In the configuration according to this embodiment, the frequency fixed filter 30 is connected to the demultiplexing circuit 50. That configuration can also provide similar advantageous effects to those in the first embodiment. Thus, the number of components can be reduced, and downsizing can be realized.

INDUSTRIAL APPLICABILITY

The radio frequency front-end circuit and the communication device according to the present disclosure can be widely applied to wireless communication. In particular, they can be suitably applied to wireless communication utilizing the TV white space.

REFERENCE SIGNS LIST 1 communication device
10, 10A, 10B, 10C, 10D radio frequency front-end circuit
20 antenna matching circuit
30 frequency fixed filter
40 frequency variable LC filter
50 demultiplexing circuit
61, 62 frequency variable filter
71 transmission-side amplifier circuit
72 reception-side amplifier circuit
80 signal processing unit
90 detection unit
91 transmission circuit
92 reception circuit
100 baseband (BB) IC
101 predistortion (PD) processing unit
102 memory
103, 104 PD calibration signal terminal
200 PD calibration circuit
601 serial arm resonance circuit
602, 603 parallel arm resonance circuit
610, 617A capacitor
611, 621, 631 resonator
611A, 612A, 613A, 614A resonance circuit
612, 615A, 622, 632 inductor
613, 623, 633 variable capacitor
616A matching circuit
801 transmitted signal generation unit
802 demodulation unit
810 channel decision unit
P601, P602 connection terminal

The invention claimed is:

1. A radio frequency front-end circuit configured to perform wireless communication in a communication band of a system, the communication band comprising a plurality of communication channels including an empty communication channel, the radio frequency front-end circuit comprising:
   a transmission-side circuit configured to produce a transmission signal corresponding to the empty communication channel from a signal already subjected to a predistortion processing; and
   a tunable filter configured to attenuate a radio frequency signal of a spurious wave at least in an alternate channel adjacent to the empty communication channel, wherein the tunable filter is configured to pass radio frequency signals in frequency bands of the empty communication channel and a channel adjacent to the empty communication channel.

2. The radio frequency front-end circuit according to claim 1, further comprising a signal terminal,
   wherein a calibration signal used to perform the predistortion processing is output to the signal terminal.

3. The radio frequency front-end circuit according to claim 2, further comprising a detection unit configured to detect a portion of the transmission signal reflected by an antenna,
   wherein the detection unit is disposed in a transfer path of the transmission signal subsequent to the tunable filter, and the signal terminal is connected to the detection unit.

4. A communication device comprising:
the radio frequency front-end circuit according to claim 2;
memory configured to store the calibration signal; and
a radio frequency integrated circuit configured to produce the signal already subjected to the predistortion processing by using the calibration signal stored in the memory, and configured to output, to the radio frequency front-end circuit, the signal already subjected to the predistortion processing.

5. The communication device according to claim 4, further comprising a baseband integrated circuit configured to perform the predistortion processing on the signal in accordance with the calibration signal, and to output, to the radio frequency integrated circuit, the signal already subjected to the predistortion processing.

6. The radio frequency front-end circuit according to claim 1, wherein the tunable filter is an acoustic wave resonator filter of frequency variable type.

7. The radio frequency front-end circuit according to claim 6, wherein:
the tunable filter comprises a parallel resonator and a serial resonator,
a resonance point of the parallel resonator is within frequencies of the alternate channel, and an anti-resonance point of the parallel resonator is within frequencies of the adjacent channel, and
a resonance point of the serial resonator is within frequencies of the adjacent channel, and an anti-resonance point of the serial resonator is within frequencies of the alternate channel.

8. The radio frequency front-end circuit according to claim 6, wherein the tunable filter comprises a tunable low pass filter constituted by a first parallel resonator, and a tunable high pass filter constituted by a second parallel resonator.

9. The radio frequency front-end circuit according to claim 1, wherein the transmission-side circuit comprises an amplifier circuit configured to, as part of producing the transmission signal, amplify the signal already subjected to the predistortion processing.

10. The radio frequency front-end circuit according to claim 1, further comprising a detection unit configured to detect a portion of the transmission signal reflected by an antenna.

11. The radio frequency front-end circuit according to claim 10, wherein the detection unit is disposed in a transfer path of the transmission signal subsequent to the tunable filter.

12. The radio frequency front-end circuit according to claim 1, further comprising:
a reception-side circuit configured to transfer a received signal corresponding to the empty communication channel;
an antenna-side circuit configured to transfer the transmission signal and the received signal;
a demultiplexing circuit that connects the transmission-side circuit and the reception-side circuit to the antenna-side circuit;
a frequency fixed filter configured to pass a radio frequency signal in the communication band of the system; and
a second tunable filter disposed between the demultiplexing circuit and the tunable filter, and configured to attenuate intermodulation distortion in the communication band of the system.

13. The radio frequency front-end circuit according to claim 1, wherein the system is a wireless communication system utilizing a TV white space,
the communication band of the system is a communication band used in TV broadcasting, and
the plurality of communication channels are channels used in the TV broadcasting.

* * * * *